United States Patent
Schäfer et al.

(10) Patent No.: US 7,076,383 B2
(45) Date of Patent: Jul. 11, 2006

(54) METHOD OF RESONANCE SPECTROSCOPY FOR THE ANALYSIS OF STATISTICAL PROPERTIES OF SAMPLES

(75) Inventors: Hartmut Schäfer, Durmersheim (DE); Peter Neidig, Ettlingen (DE); Christian Fischer, Karlsbad (DE); Manfred Spraul, Ettlingen (DE)

(73) Assignee: Bruker Biospin GmbH, Rheinstetten (DE)

( * ) Notice: Subject to any disclaimer, the term of this patent is extended or adjusted under 35 U.S.C. 154(b) by 29 days.

(21) Appl. No.: 10/921,108

(22) Filed: Aug. 19, 2004

(65) Prior Publication Data

US 2005/0060112 A1 Mar. 17, 2005

(30) Foreign Application Priority Data

Sep. 12, 2003 (EP) .................................. 03020753

(51) Int. Cl.
*G01R 23/16* (2006.01)
(52) U.S. Cl. ............................ 702/76; 702/75; 702/77; 324/300; 436/173
(58) Field of Classification Search .................. 702/76, 702/77, 75; 324/307, 303, 306, 309, 300; 436/173, 174
See application file for complete search history.

(56) References Cited

U.S. PATENT DOCUMENTS 5,572,125 A * 11/1996 Dunkel ....................... 324/307

5,838,156 A * 11/1998 Miyabayashi ................ 324/307

FOREIGN PATENT DOCUMENTS

| WO | WO 96 21 867 | 7/1996 |
| WO | WO 02 067 005 | 8/2002 |

OTHER PUBLICATIONS

E. Holmes et al.: "Development of a model for classification of toxin-induced lesions using /sup 1/H NMR spectroscopy of urine combined with pattern recognition" NMR in Biomedicine, vol. 11, 1998, pp. 235-244, XP008027233 ISSN: 0952-3480 *pp. 237-242:"1H NMR spectroscopic analysis . . . "—SIMCA analysis . . . .

(Continued)

*Primary Examiner*—John Barlow
*Assistant Examiner*—Hien Vo
(74) *Attorney, Agent, or Firm*—Paul Vincent

(57) ABSTRACT

The invention refers to a method of resonance spectroscopy for the analysis of statistical properties of samples, comprising the following steps: a) recording of a complex resonance frequency spectrum of each sample by means of phase sensitive quadrature detection; b) numerical differentiation of the recorded complex resonance frequency spectra versus frequency; c) determination of the absolute value of each differentiated complex resonance frequency spectrum (=fingerprint); d) allocation of each fingerprint to a point of a multidimensional point set; and e) performing a pattern analysis of the generated points for characterizing the statistical properties of the samples. The inventive method tolerates unintended variances of measurement in the recorded resonance frequency spectra, in particular caused by phase errors, and allows reliable automated spectral analysis.

18 Claims, 13 Drawing Sheets

OTHER PUBLICATIONS

Y. Kuroda et al.: "Postacquisition data processing method for suppression of the solvent signal" Journal of Magnetic Resonance, vol. 84, 1989, pp. 604-610, XP008027111 ISSN: 0022-2364 *the whole document*.

W.J. Goux: "NMR pattern recognition of paracetylated mono- and oligosaccharide structures. Classification of residues using principal component analysis. K-nearest neighbor analysis, and SIMCA class modeling" Journal of Magnetic Resonance, vol. 85, 1989, pp. 457-469, XP008027232 ISSN: 0022-2364 *p. 458, paragraph 3—p. 467, paragraph 3*.

G. Okide et al.: "The selection of NMR spectral features leading to the optimum classification of residue types in peracetylated oligosaccharide derivatives" Journal of Magnetic Resonance, vol. 96, 1992, pp. 526-540, XP008027231 ISSN: 022-2364 *p. 527, paragraph 2—p. 539*.

C.S.Johnson Jr.: "Diffusion ordered nuclear magnetic resonance spectroscopy principles and applications" in: Progress in Nuclear Magnetic Resonance Spectroscopy 34 (1999) pp. 203-256.

Li Chen et al.: "An efficient algorithm for automatic phase correction of NMR spectra based on entropy minimization"in: Journal of Magnetic Resonance 158 (2002) pp. 164-168.

Douglas E. Brown et al.: "Automated Phase Correction of FT NMR Spectra by Baseline Optimization" in: Journal of Magnetic Resonance 85 (1989), pp. 15-23.

Edward C.Craig et al.: "Automated Phase Correction of FT NMR Spectra by Means of Phase Measurement Based on Dispersion versus Absorption Relation (DISPA)" in: Journal of Magnetic Resonance 76, (1988), pp. 458-475.

Gerald A. Pearson: "A General Baseline-Recognition and Baseline-Flattening Algorithm" in: Journal of Magnetic Resonance 27,(1977), pp. 265-272.

* cited by examiner

METHOD OF RESONANCE SPECTROSCOPY FOR THE ANALYSIS OF STATISTICAL PROPERTIES OF SAMPLES

This application claims Paris Convention priority of EP 03 020 753.4 filed Sep. 12, 2003 the complete disclosure of which is hereby incorporated by reference.

BACKGROUND OF THE INVENTION

The invention relates to a method of resonance spectroscopy for the analysis of statistical properties of samples.

An example for a method for determining properties of an investigated mixture by resonance spectroscopy can be found in C. S. Johnson, "Diffusion ordered nuclear magnetic resonance spectroscopy: principles and applications", in Progress in Nuclear Magnetic Resonance Spectroscopy 34 (1999), 203–256.

Resonance spectroscopy, in particular nuclear magnetic resonance spectroscopy, is a powerful tool for investigating samples (ref. /4/, /5/). E.g. the presence and the concentration of elements or compounds can be determined by means of resonance spectroscopy. In general, element or compound concentrations are determined by looking for characteristic resonance lines in the measured spectra and measuring the intensity of these lines.

In some applications, large amounts of samples need to be investigated in order to classify samples. For example, such a classification may be a separation of quality fractions of products in an industrial production process, or a healthy/non-healthy classification of blood samples in medicine. In these applications, statistical data analysis can be carried out, in particular pattern recognition (ref. /1/, /3/), in order to speed up the analysis.

According to the state of the art, the real part of each spectrum to be investigated is allocated to a point in an n-dimensional space (or point set), with n being a number of parameters extracted from each spectrum. These parameters may be, for example, intensity values at certain frequencies in the resonance spectra. All points are then displayed in the n-dimensional space. The points of spectra belonging to samples of the same classification can typically be found in a closed region of the n-dimensional space. Thus, by checking the position of a point in the n-dimensional space, the respective sample can—in principle—be classified.

However, typical spectra contain numerous spectral lines, and if the dimension n of the point set is too large; differences between the samples (resp. their spectra) are difficult to recognize. Fortunately, changes in different regions of the spectra are typically correlated. In this situation, principal component analysis can be performed in order to reduce the dimensionality of the relevant parameter space. Once relevant principal components (typically one, two or three) are known, the points representing the spectra may be transformed to a principal component basis, and classification of the samples is relatively easy then. A model for classification of samples using principal component analysis is disclosed in E. Holmes et al "Development of a model for classification of toxin-induced lesions using $^1$H NMR spectroscopy of urine combined with pattern recognition".

In principle, all tools for an automated measurement of the spectra and the subsequent statistical analysis are available in the state of the art. Automated information acquisition would be very fast and inexpensive.

However, the reliability of such an automatic information acquisition in the state of the art is inadequate. The reason for this are random variances of measurement in the physical spectra recorded, in particular in the real parts of the spectra. Three of these variances are particularly important. First, there is an error due to imperfect base line correction. Second, the suppression of dominating but unwanted resonances of the samples (in particular solvent suppression in NMR) may be imperfect. And most important, there are phase errors in the recorded resonance spectra, deterring the spectra.

These three sources of unintended variances in the spectra superimpose the relevant variances in the spectra due to variances in the properties of the samples. Relevant variances can be mistaken for unintended statistical variances, or unintended statistical variances can be mistaken for an information containing variance. In effect, the relevant (i.e. information containing) variances are masked by the unintended variances to such a degree that an automatic analysis of the spectra becomes impossible. In the state of the art, there is no reliable tool for automatic correction or compensation of base line error, imperfect suppression of dominant but unwanted resonances and/or phase error. Corrections have to be performed manually. Automated analysis turns out to be insufficient. Even when manual corrections are carried out, different human operators still introduce deviations among the corrected spectra which are not caused by the physical properties of the respective samples. Known methods of phase corrections are published in references /6/–/9/.

It is the object of the invention to present a method of resonance spectroscopy which tolerates the above described unintended variances of measurement in the recorded resonance frequency spectra, in particular caused by phase errors, and allows reliable automated spectra analysis.

SUMMARY OF THE INVENTION

This object is achieved by a method of resonance spectroscopy for the analysis of statistical properties of samples, comprising the following steps:

a) recording of one complex resonance frequency spectrum per each sample by means of phase sensitive quadrature detection;

d) allocation of fingerprints to points of a n-dimensional point set, whereby n is the number of parameters extracted from each spectrum;

e) performing a pattern analysis of the generated points for characterizing the statistical properties of the samples by checking the position of the points within the n-dimensional spectrum, characterized in that between step a) and step d) the following steps are carried out:

b) numerical differentiation of the detected complex resonance frequency spectra versus frequency; and c) acquiring of the fingerprints by determination of the absolute values of each differentiated complex resonance frequency spectrum =fingerprint.

The basic idea of the invention is to record a complex resonance frequency spectrum and use both parts of the spectrum. First, the first derivative with respect to the frequency is calculated, and then the absolute value of the differentiated complex spectrum is calculated. This absolute value is called the fingerprint of the spectrum resp. of the respective sample The fingerprint is very similar to the real part of a manually well-corrected spectrum, and as a function of the frequency it carries substantially the same information. This similarity can be understood by the mathematical properties of Lorentzian lines: By differentiation of a Lorentzian line and subsequent calculation of the absolute value of this first derivative, the real part of the original Lorentzian line is reproduced. However, the fingerprint has a reduced unintended variance due to phase error, base line error, or suppression error of dominant but unwanted resonances. Through calculating the absolute value as an intermediate step, the absolute phase of the recorded spectrum becomes irrelevant and the phase error is completely eliminated. Variances due to a base line error or an imperfect suppression of dominant but unwanted resonances typically result in broad distortions in the recorded spectrum. Through calculating the first derivative, the influence of these distortions is reduced, and in the fingerprint, the influence of the base line error and the suppression error of dominant but unwanted resonances are reduced to a negligible level.

By means of the invention, a fully automatic analysis of the recorded spectra becomes possible. The above mentioned unintended variances are so effectively suppressed that the relevant variances can reliably be recognized and analyzed automatically. Therefore, an apparatus for automatically performing the inventive method of resonance spectroscopy is part of the present invention.

The inventive method can also include a step of integrating the recorded complex resonance frequency spectrum over small intervals of frequency, thus reducing the digitization grid density in the integrated spectrum relative to the recorded spectrum. The integrated spectrum can then be used in the further calculations, thus accelerating subsequent calculations. For example, an originally recorded complex resonance frequency spectrum with 65536 frequency channels can be reduced to an integrated complex resonance frequency spectrum of 256 frequency channels by summing up the intensity values of 256 channels each. Furthermore, irrelevant spectral regions can be excluded prior to pattern analysis.

In a preferred variant of the inventive method, the pattern analysis comprises Principal Component Analysis (=PCA) and/or Cluster-Analysis and/or Multidimensional Scaling and/or K-Nearest-Neighbor-Analysis (=KNN). PCA is useful for recognizing the number of influence variables in a set of the samples.

In another preferred variant, the pattern analysis comprises a regression process, in particular Multivariate Least Squares Regression (=MLR), Reduced Rank Regression (=RRR), Principal Component Regression (=PCR) or Partial Least Squares Regression (=PLS).

Further preferred is a variant wherein the pattern analysis comprises a Discriminant Analysis and/or a Canonical Correlation Analysis (=CCA) and/or the application of neuronal networks and/or genetic algorithms.

Also preferred is a variant characterized in that the pattern analysis comprises a SIMCA classification.

All these methods of pattern analysis cooperate well with the inventive method of resonance spectroscopy.

In an advantageous variant of the inventive method the allocation of each fingerprint to a point is performed with a Wavelet process.

In a highly preferred variant of the inventive method, the samples originate from a single test object, wherein the samples were taken at different points of time.

A test object can be e.g. an animal, and samples of its blood are taken at equidistant time intervals. This can be used to survey the progress of an illness or a poisoning. Samples may also be taken at time intervals from a mixing container for chemicals, for example, in order to survey the composition of the mixture. Thus, a possible and advantageous application of this variant can be process control or process optimization. It is also possible to investigate an identical sample at different points of time, for example to monitor the decay of a chemical substance within the sample.

In another highly preferred variant, the samples originate from different test objects each. This variant can be applied for screening, for example. Again, human beings may constitute test objects. In particular, the health of different human beings can be checked. This may be useful to learn about inborn diseases of a new born babies which may require immediate medication in order to avoid permanent damages. In accordance with the invention, samples may also be taken from a multitude of test objects, wherein a multitude of samples is taken from each test object at different points of time.

Also in accordance with the invention is a method of resonance spectroscopy for the analysis of the properties of a sample, comprising the following steps:

a') recording of a complex resonance frequency spectrum of the sample by means of phase sensitive quadrature detection;

d') phase correction of the complex resonance frequency spectrum using a fingerprint as the objective function for the real part of the complex resonance frequency spectrum, characterized in that between step a) and step d) the following steps are carried out:

b') numerical differentiation of the recorded complex resonance frequency spectrum versus frequency;

c') acquiring of the fingerprint by determination of the absolute value of each differentiated complex resonance frequency spectrum.

The fingerprint of a non-phase corrected spectrum provides an approximation of the real part of the same but correctly phase corrected (=phased) spectrum. That means that an automated phase correction routine can be set up such that the phase is automatically tuned until the real part of the tuned spectrum matches its fingerprint best. As an example, the best match can be found by looking for the best covariance of fingerprint and tuned spectrum, and may take into account phases of zero order and first order. Then, the spectra corrected according to the described algorithm can be used directly in an automated pattern analysis, in particular when problems due to baseline correction and imperfect suppression of dominant but unwanted resonances are rather small.

While the inventive method described in the beginning uses the fingerprint as a replacement for the real part of the spectrum in pattern analysis, the inventive method described immediately above shows a way how to obtain the true phase corrected spectrum from the recorded spectrum.

As long as the assumption is valid that the peaks in the recorded spectrum are approximately of Lorentzian shape, the fingerprint is a very good approximation for a phase corrected real part of the spectrum. Therefore, the fingerprint constitutes an excellent objective function for elimination of the phase error in the recorded resonance frequency spectrum.

In the same way as a phase corrected spectrum is determined in accordance with the invention described above, a base line corrected spectrum can be determined. The uncorrected spectrum is tuned considering different possible baselines, and the tuned spectrum matching the fingerprint the best is taken for the final base line correction. This latter procedure works particularly well in case of a low density of resonance lines.

Further preferred is a variant of the inventive methods described above wherein the method of resonance spectroscopy is a method of Fourier spectroscopy.

In a highly preferred variant of the inventive methods described above, the method of resonance spectroscopy comprises a method of nuclear magnetic resonance (=NMR), in particular a high resolution NMR method, or a method of electron spin resonance (=ESR) or a method of ion cyclotron resonance (=ICR). These are powerful methods for the chemical analysis and/or the identification of chemical bonds.

In an alternative variant, the method of resonance spectroscopy determines acoustic or electrical or magnetic resonances. Mechanical resonance spectroscopy may be used to identify cracks or other damages in test objects such as motor vehicles, airplanes, washing machines and the like during operation.

A particularly preferred variant of the inventive methods is characterized in that the sample or the samples comprise biofluids, in particular urine, blood, spinal cord liquid or plant extracts, and/or biological semi-solid material, in particular tissue, and/or biological solid material, in particular bone. For biological samples, natural variances of concentrations occur very often, so that an analysis of statistical properties of the samples is desirable. The handling of large numbers of samples and a quick automated analysis are usually required, so that the advantages of the invention are fully used.

In a variant of the method also preferred, the sample or the samples comprise foodstuff and/or intermediate products of foodstuff, for example fruits or fruit juice. The analysis performed with the inventive method can be used to identify the origin of foodstuff or to test foodstuff for impurities.

A further variant of the inventive method is used in material tests and/or criminology, in particular for detection of drugs and/or determining the origin of drugs, and/or for analyzing fuels. The inventive method is particularly reliable and cost-effective, in particular when performed automatically.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawings.

BRIEF DESCRIPTION OF THE DRAWING

FIG. 2b shows the first derivative of the Lorentzian line of FIG. 2a;

FIG. 2c shows the absolute value of the complex first derivative of the Lorentzian line of FIG. 2b overlayed with the real part of the Lorentzian line of FIG. 2a;

FIG. 6b shows curves corresponding to FIG. 6a, but with a narrow peak to peak distance, with the distance about ½,5 times the distance as in FIG. 6a;

DESCRIPTION OF THE PREFERRED EMBODIMENT

The invention offers an alternative strategy on how to deal with spectra affected by phase and base line errors as input for multivariate statistics.

The quality of results of multivariate statistical analysis of NMR spectra is strongly dependent on the quality of referencing, solvent suppression, shimming, phase and baseline correction. If one or more of these aspects is/are poorly dealt with, statistical analysis may be completely spoiled providing literally unusable results. Especially phase and baseline errors are notorious for hampering automated NMR screening. Although automation of phasing and baseline correction has been subject of several studies, currently no perfectly reliable strategy is available. On the other hand, manual phasing and baseline correction is a tedious and time consuming procedure and can not realistically be considered in an automation context. In the following, an alternative to phasing and baseline correction will be presented which may at least give semi-quntitative multivariate statistical results. Although the theoretical concept is derived based on of the assumption of Lorentzian line shapes, the results should apply even if the line shape assumption does not apply in the strict sense.

In the following, we consider spectra consisting of superpositions of Lorentzian lines. Purely mathematically speaking, the Lorentzian line shape is defined by $$s(x) = \frac{1}{1+x^2} + i\frac{x}{1+x^2}.$$

Figure 1:
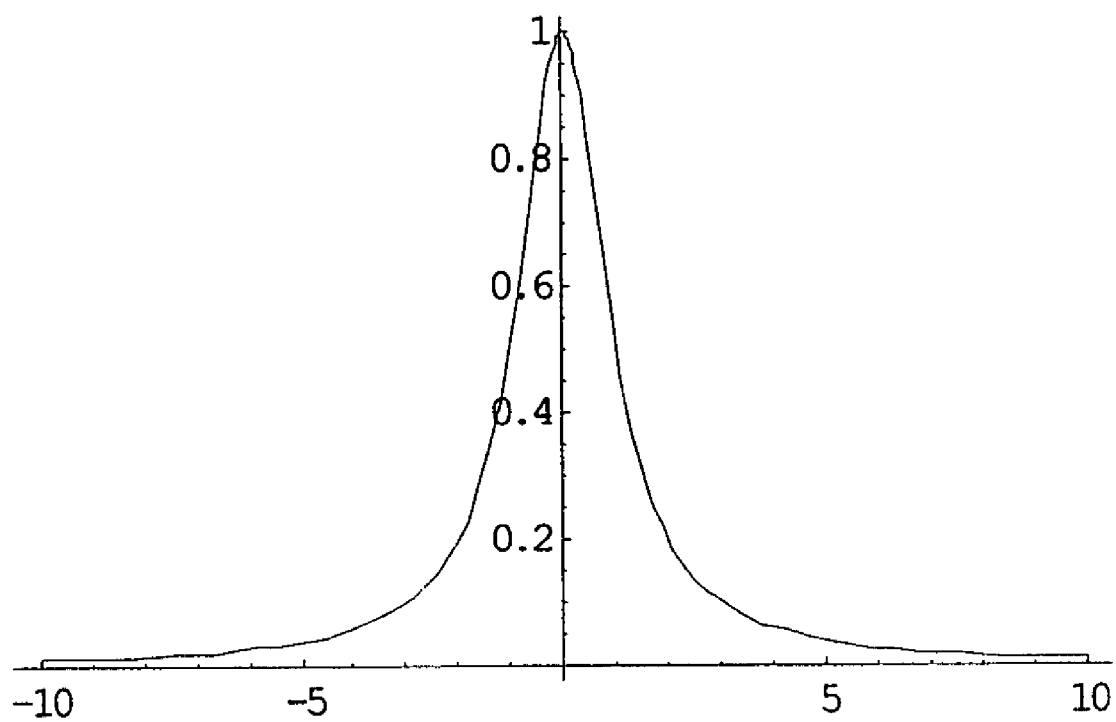
FIG. 1 shows the real part of a Lorentzian line.

In FIG. 1, the real part of the Lorentzian line is shown. The center is at x=0 and its linewidth is equal to one.

The first derivative of $s(x)$ is given by $$\frac{\partial s}{\partial x} = -\frac{2x}{1+x^2} - i\left(\frac{2x}{(1+x^2)^2} - \frac{1}{1+x^2}\right).$$

The absolute value of the first derivative is similar to the real part of the Lorentzian line shape, i.e.

$$\left|\frac{\partial s}{\partial x}\right| = \Re(s(x)) = \frac{1}{1+x^2}.$$

Repeating again: this operation (1. calculation of the first derivative of the complex spectrum and 2. determination of the absolute value, i.e. magnitude calculation) reproduces the real part of the Lorentzian line.

Figure 2A:
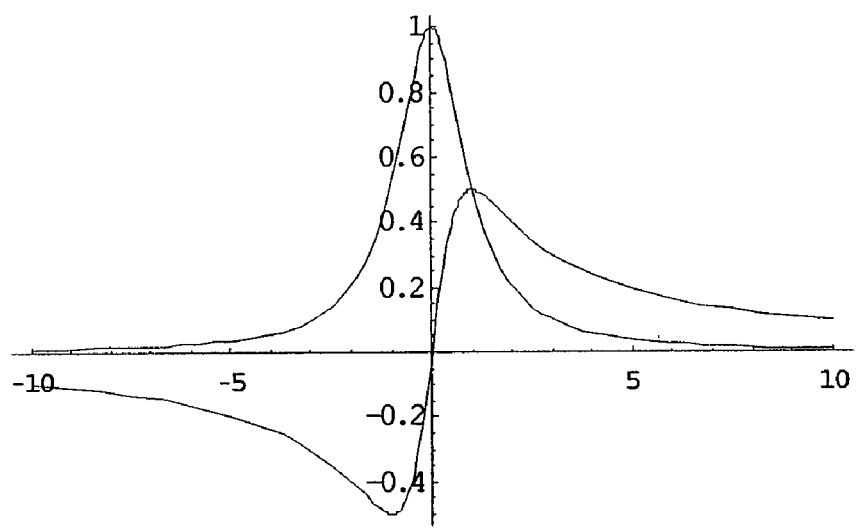
FIG. 2a shows the real part and the imaginary part of a Lorentzian line.
Figure 2B:
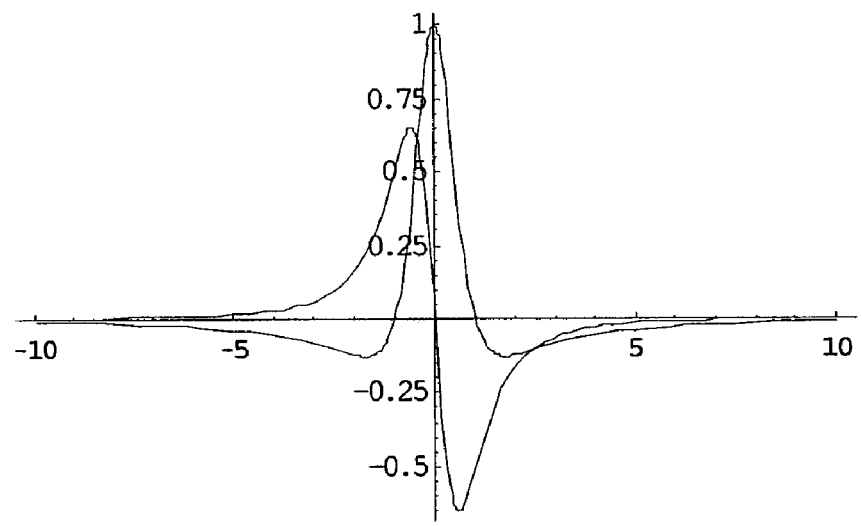
Figure 2C:
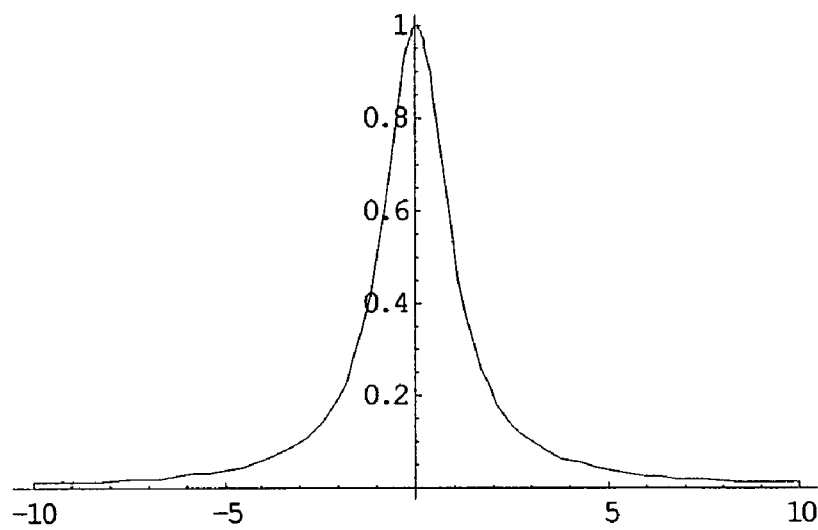

This is illutrated in FIG. 2. FIG. 2 shows the real and imaginary part of a Lorentzian line a) and their first derivatives b). In c) the absolute value of the complex first derivative is overlaid with the original real part line shape function. The functions are identical. Note that phase errors do not affect the absolute value of the complex first derivative.

As a consequence, the real part of a spectrum consisting of a number of non-overlapping Lorentzian lines of similar line width is almost perfectly reproduced by the absolute value of its first derivative. No phasing is needed to obtain the real part. For experimental examples see FIGS. 10 through 13 described below.

Figure 3A:
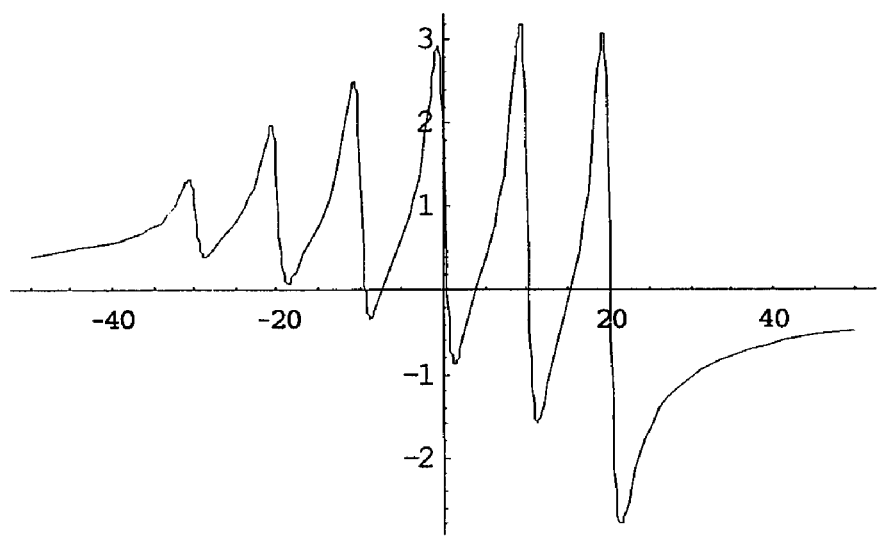
FIG. 3a shows a phase error affected superposition of six Lorentzian lines.
Figure 3B:
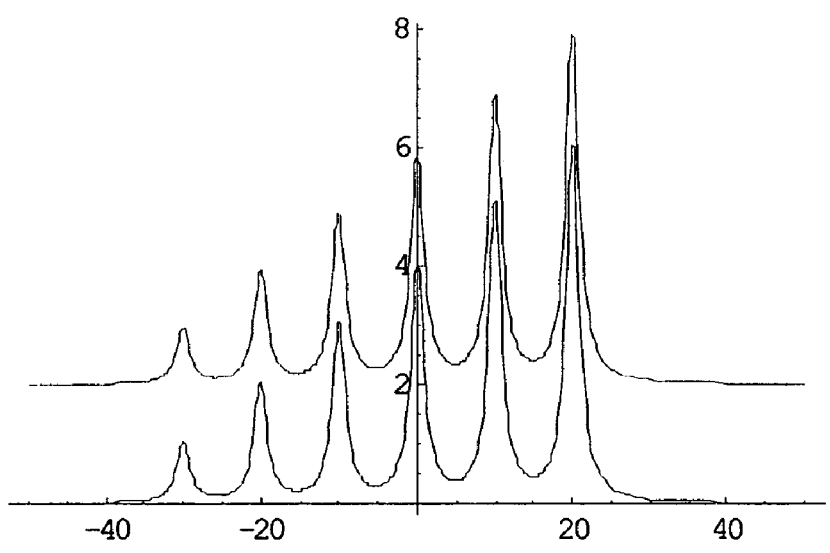
FIG. 3b shows the phase corrected real part of the spectrum of FIG. 3a (top) and the absolute value of the first derivative of the non-phase corrected complex spectrum of FIG. 3a (bottom)

FIG. 3 shows a phase error affected superposition of 6 Lorentzian lines a). In b) the result of the absolute value of the first derivative of the non-phase corrected complex spectrum is plotted (bottom) together with the phase corrected real part spectrum (top).

The situation is more complex
(a) if lines of different line width co-exist in a spectrum and/or
(b) if lines are strongly overlapping.

Case (a) shall be considered first where we start from a spectral line of half width $\Delta\omega$ $$s(\omega) = \frac{\Delta\omega}{2\pi}\left\{\frac{1}{1+[2(\omega-\omega_0)/\Delta\omega]^2} + i\frac{2(\omega-\omega_0)/\Delta\omega}{1+[2(\omega-\omega_0)/\Delta\omega]^2}\right\}$$

which is normalized to one. Then, the absolute value of the first derivative of the complex spectral line is given by:

$$\left|\frac{\partial s}{\partial \omega}\right| = \frac{2}{\Delta\omega}\Re\{s(\omega)\}.$$

The result is proportional to the real part of the initial line, however scaled by the inverse of the line width. That means, that by the manipulation (differentiation+absolute value calculation) the intensity of broad lines is attenuated compared to the intensity of narrow lines: the broader the lines the stronger the attenuation.

Figure 4:
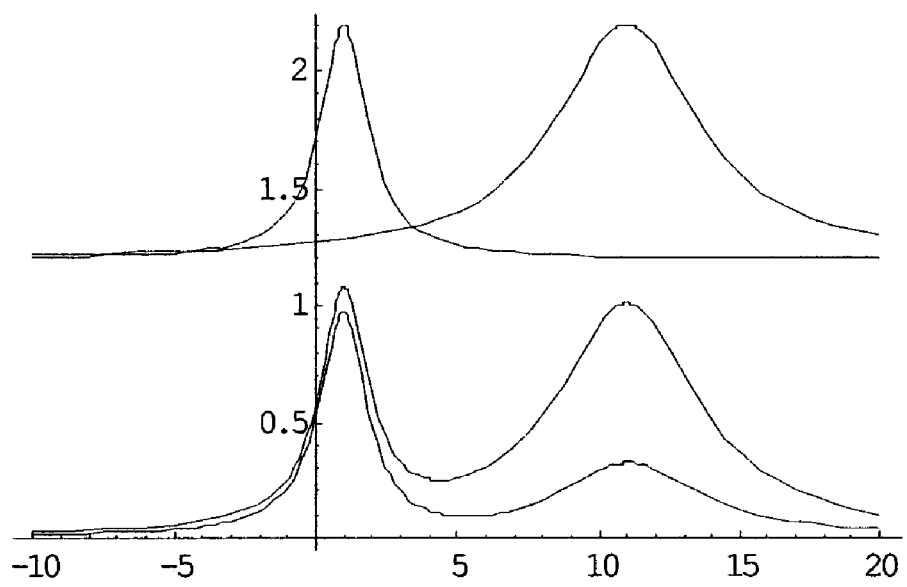
FIG. 4 shows two Lorentzian lines (top diagram), and the superposition of the two Lorentzian lines (bottom diagram, upper curve) and a manipulated curve of said superposition after differentiation and absolute value calculation (bottom diagram, lower curve)

FIG. 4 shows the effect of the line width on the result of a manipulation via differentiation and absolute value calculation. Two Lorentzians (top) are superposed. The resulting spectrum and the result of the manipulation are given in the lower part of the figure.

This attenuation effect may be problematic when proper intensity ratios are needed. However, the advantage is that any distortions due to base line problems or imperfect water suppression are not transferred into the absolute value of the derivative of the spectrum, i.e. into the fingerprint.

Figure 5A:
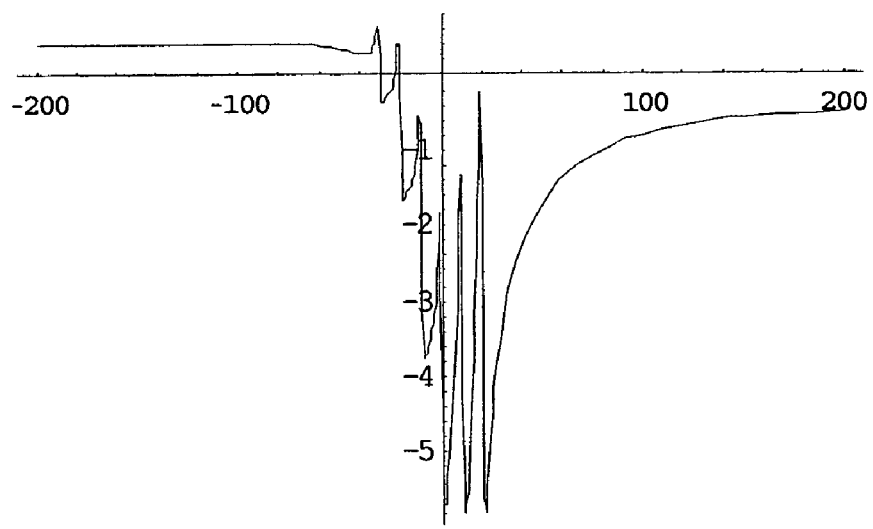
FIG. 5a shows a phase error affected superposition of six Lorentzian lines added with a very broad phase twisted Lorentzian background signal and a linear offset.
Figure 5B:
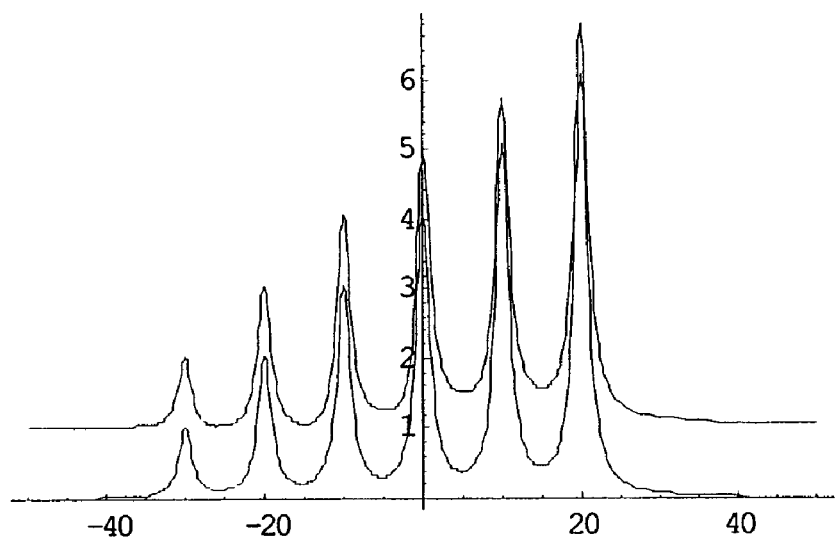
FIG. 5b shows the phase corrected real part of the spectrum of FIG. 5a (top) and the absolute value of the first derivative of the non-phase corrected complex spectrum of FIG. 5a (bottom)

FIG. 5 illustrates a phase error affected superposition of 6 Lorentzian lines a) added with a very broad phase twisted Lorentzian back ground signal and a linear offset. In b) the result of the absolute value of the first derivative of the non-phase corrected complex spectrum is plotted (bottom) together with the phase corrected real part spectrum without offset and background signal (top).

Case (b) mentioned above considers complications due to strongly overlapping lines. Strictly speaking, intensity ratios and line shapes of two lines close to each other are modified when applying differentiation and subsequent absolute value calculation.

Figure 6A:
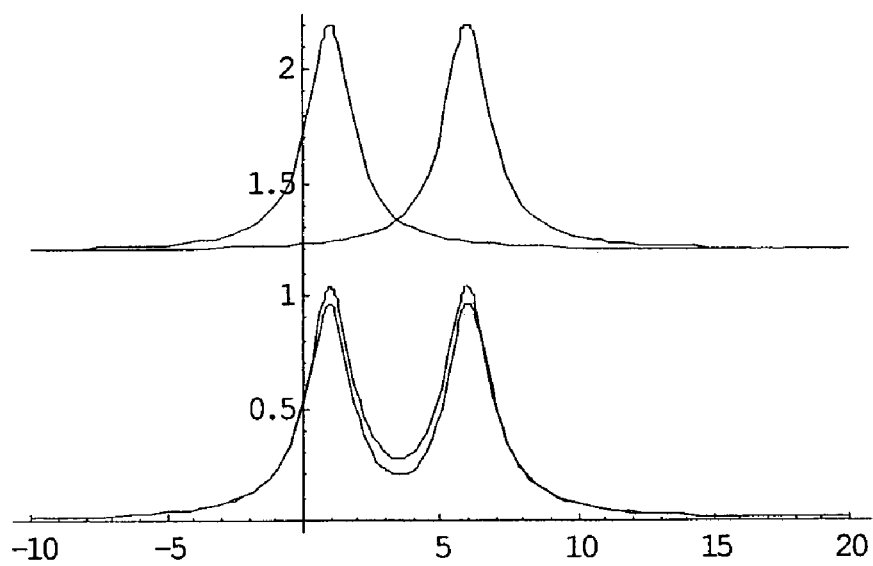
FIG. 6a shows a superposition of two Lorentzian lines of equal line width with a large peak to peak distance (top diagram), and the superposition of the two Lorentzian lines (bottom diagram, upper curve) and a manipulated curve of said superposition after differentiation and absolute value calculation (bottom diagram, lower curve)
Figure 6B:
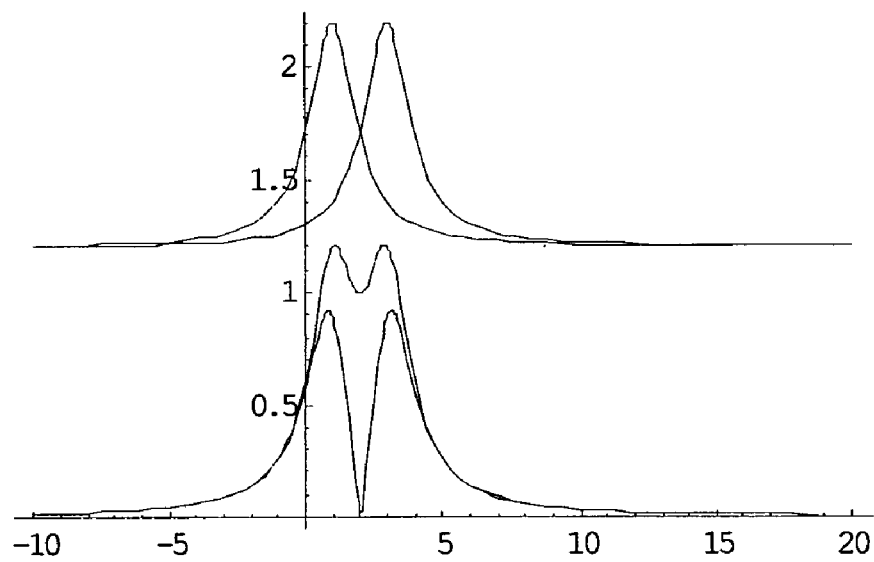

This is illustrated in FIG. 6. FIG. 6 shows the superposition of two Lorentzians of equal line width (top). In a) the peak-to-peak distance is 2.5 times the line width whereas in b) it is one time the line width. In the lower part of the figure, the resulting spectra and the results of the manipulation are given.

Problems only occur in an intermediate range, where line positions are not identical on one hand and are not too far from each other on the other hand. The degree of nonlinearity after the manipulation is illustrated in the FIG. 7. Spectra are simulated by a superposition of two lines of equal line width. The intensity of one line at frequency 0 (the reference line) is kept constant while the intensity of the second line is modified from zero to twice the intensity of the reference line. The change of intensity of the absolute value derivative spectrum is compiled as function of the intensity of the second line. Ideally, one would expect a straight line at slope one. However, the closer the lines, the higher the degree of nonlinearity at lower intensity values of the second line.

Figure 7:
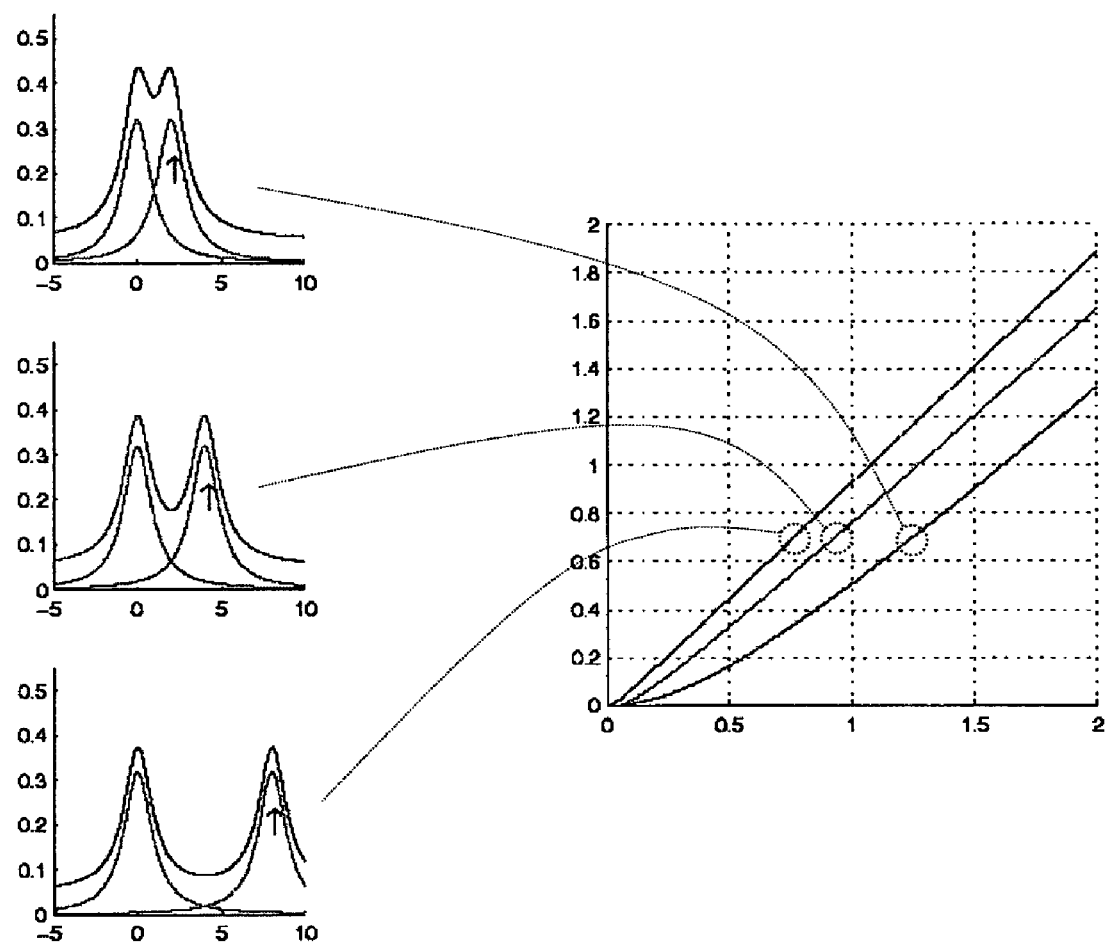
FIG. 7 shows three diagrams each showing two Lorentzian lines of equal line width with different peak to peak distances and their superposition (left), and a diagram plotting the intensity modification of the absolute value derivative spectra (corresponding to the left diagrams) versus the intensity of the right Lorentzian, varied from zero to twice the intensity of the left Lorentzian.

In detail, FIG. 7 illustrates the superposition of two Lorentzians of equal line width (left). The intensity of the right line (indicated by an arrow) is modified from zero to twice the intensity of the left line which is kept at a constant value. The right plot shows the intensity modification of the absolute value derivative spectrum as function of the intensity of the right line.

Figure 8:
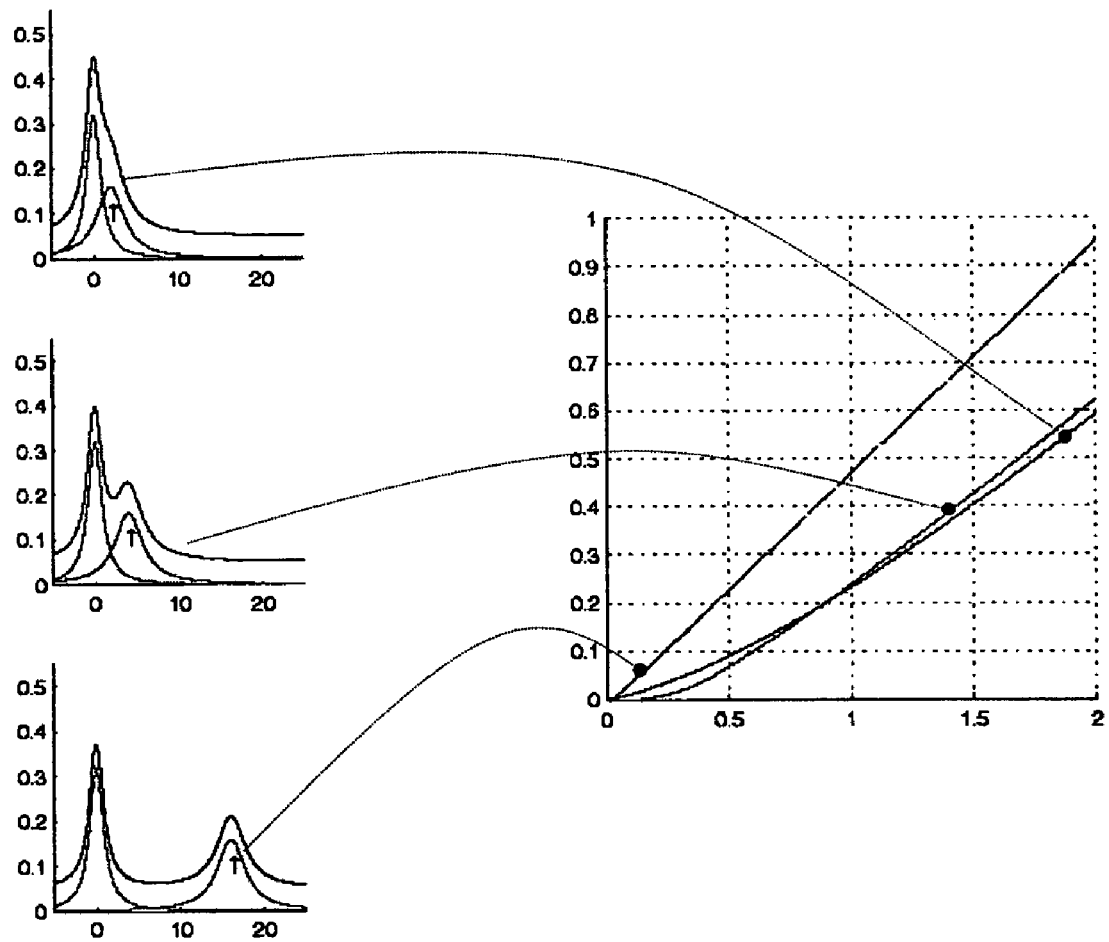
FIG. 8 shows curves corresponding to FIG. 7, but with different line widths of the two Lorentzian lines in each left diagram.

In a second simulation shown in FIG. 8, the two superposed lines did not have similar line width. Instead, the test line with varying intensity had twice the line width than the reference line.

In detail, FIG. 8 shows the superposition of two Lorentzians of different line width (left). The intensity of the right line (indicated by an arrow) is modified from zero to twice the intensity of the left line which is kept at a constant value. The right plot shows the intensity modification of the absolute value derivative spectrum as function of the intensity of the right line.

As a consequence of this non-linear behaviour, intensity fluctuations of small lines at low intensities are more affected than fluctuations of strong intensity lines. In the linear limit, fluctuation intensities are transferred into intensity fluctuations in the respective absolute value of the derivative scaled by the inverse of the line width.

The non-linearity affects the results of multivariate statistics. This shall be illustrated on base of an analysis of a set of spectra from mixtures of apple and pear juice, compare FIG. 9. 60 samples where analyzed, wherein 10 samples were prepared for each mixing level out of 0, 10, 20, 30, 40 and 100% pear juice percentage. Bucketing was performed twice, at first using the pure real part spectra (normal bucketing mode) and second using the absolute value of the first derivative of the complex spectra (special bucketing mode). The bucketing range was 0 to 10 ppm, the bucket size was 0.04 ppm and the water region was excluded (4.5 to 6 ppm). Principal component analysis (PCA) was performed on each table and the results are given in FIG. 9.

Figure 9:
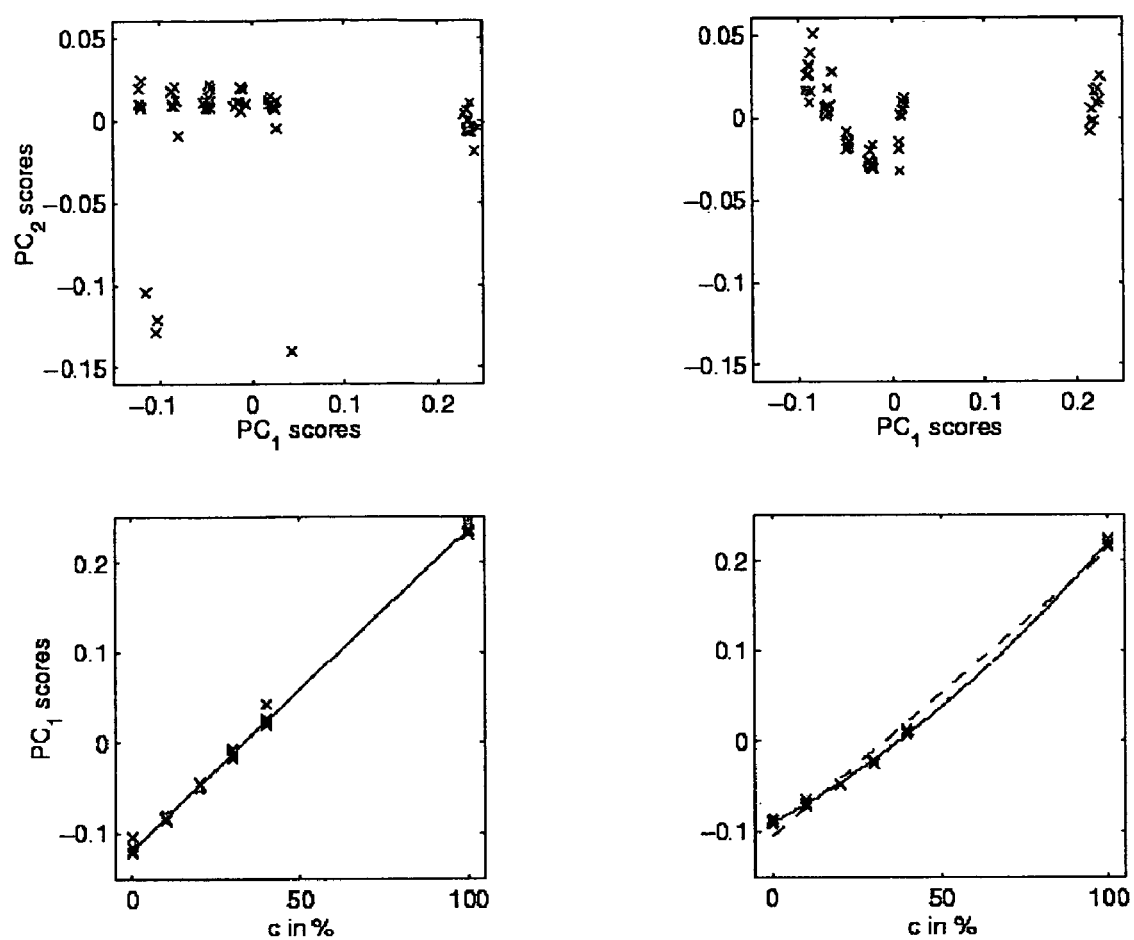
FIG. 9 shows a principal component analysis of bucket tables originating from a set of spectra from mixtures of apple juice and pear juice; the two upper diagrams show plots of principal component 2 (PC2) versus principal component 1 (PC1); the two lower plots show plots of PC1 versus the concentration of pear juice; left diagrams are from state of the art bucketing, and right diagrams are from inventive bucketing.

In detail, FIG. 9 shows a principal component analysis of bucket tables originating from a set of spectra from mixtures of apple and pear juice. The upper plots show PC1–PC2 scores plots. The lower plots display the PC1 scores value as function of the pear juice concentration c. Left plots show the results related to the normal bucketing mode whereas the right plots are related to the new special bucketing mode using the absolute value of the first derivative of the complex spectra. The latter results are not dependent on phasing and base-line correction quality.

Clearly, the mixing levels are-well discriminated in the PC1–PC2 scores plots in both cases. Interestingly, the spread in PC2 is larger in the normal bucketing mode. Detailed inspection revealed that the outliers in the scores plot resulting from the normal bucketing mode are due to substantial baseline errors. Those outliers do not occur in case of PCA on the tables resulting from the special bucketing mode. The reason is obvious: baseline errors are suppressed in this bucketing mode due to the properties of first derivatives. When displaying the PC1 scores values as function of the pear juice concentration, one can see a pure linear behaviour in case of the normal bucketing mode, as one would expect. In the inventive special bucketing mode there is a slight deviation from the linear relation reflecting the non-linearity discussed earlier already. However, both results (i.e. dependencies) are well defined and similarly suited for prediction of concentration ratios from newly incoming samples. This only depends on the quality of model building which may be optimized by sufficiently many samples as input for model building. It should be noted that the PCA results arising from the special bucketing mode were not depending on the quality of phasing and base line correction as expected from the previous discussion.

In conclusion, an alternative method on how to extract multivariate statistical information contained in badly phase and base line corrected spectra was introduced. In high resolution NMR, the advantages of the method more than compensate for problems arising from nonlinear effects. However, care has to be taken when shimming is not completely under control. The same resonance would result at least in a broader line if shimming was not at optimum. The resulting absolute value of the first derivative would be artificially attenuated. That means, if multiple spectra shall be used in the same statistical context, shimming quality should be similar for all of them.

FIGS. 10 through 13 show experimental data illustrating the advantages of the invention.

Figure 10:
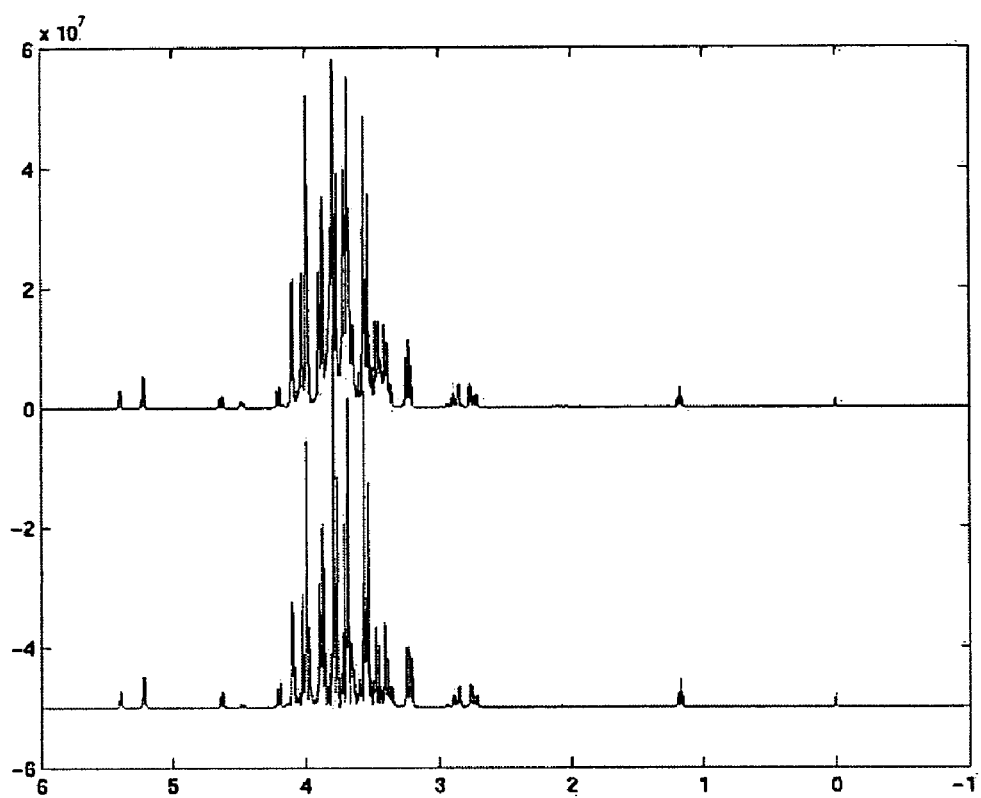
FIG. 10 shows a manually phase corrected NMR spectrum of an apple juice (top) and the absolute value of the first derivative of the corresponding complex spectrum, i.e. the corresponding fingerprint (bottom)

FIG. 10 shows a manually phase corrected apple juice spectrum (top) and the absolute value of the first derivative of the corresponding complex spectrum (bottom). Differences between both functions are rather minor.

Figure 11:
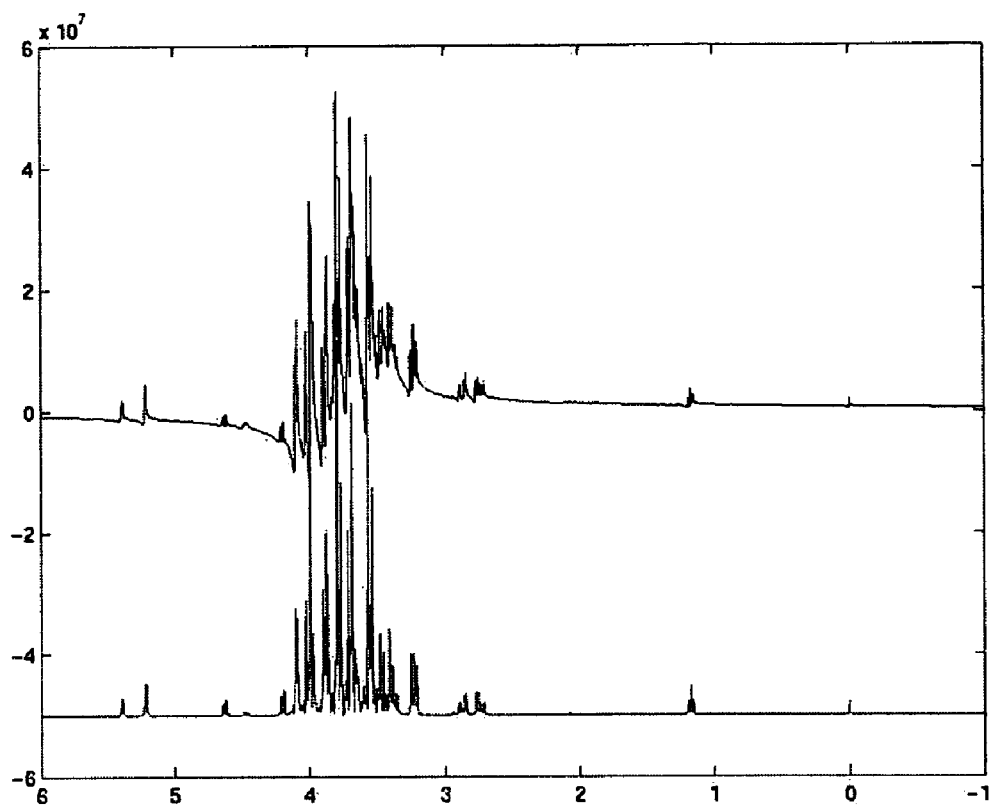
FIG. 11 shows a dephased NMR spectrum of apple juice (top) and the corresponding fingerprint (bottom)

FIG. 11 shows a dephased apple juice spectrum (top) and the absolute value of the first derivative of the corresponding complex spectrum (bottom). The quality of the latter is not affected by the phase error.

Figure 12:
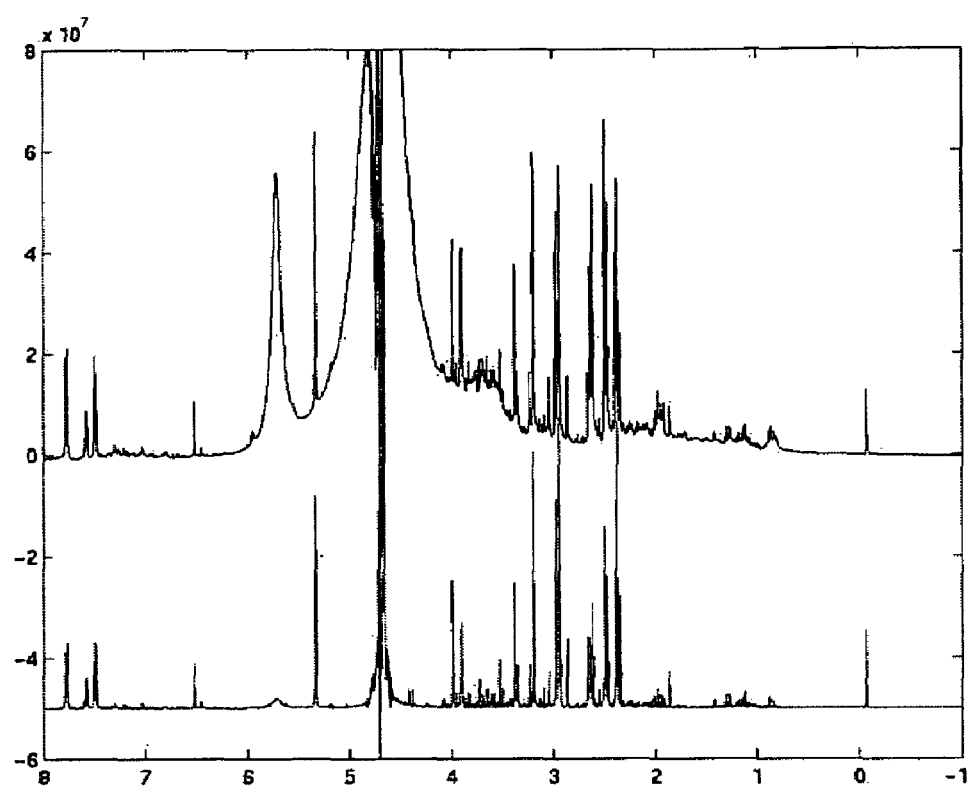
FIG. 12 shows an NMR spectrum of rat urine with imperfect water suppression (top) and the corresponding fingerprint (bottom)

FIG. 12 shows a rat urine spectrum (top) and the absolute value of the first derivative of the corresponding complex spectrum (bottom). The distortions due to imperfect water suppression are not transferred into the latter function.

Figure 13:
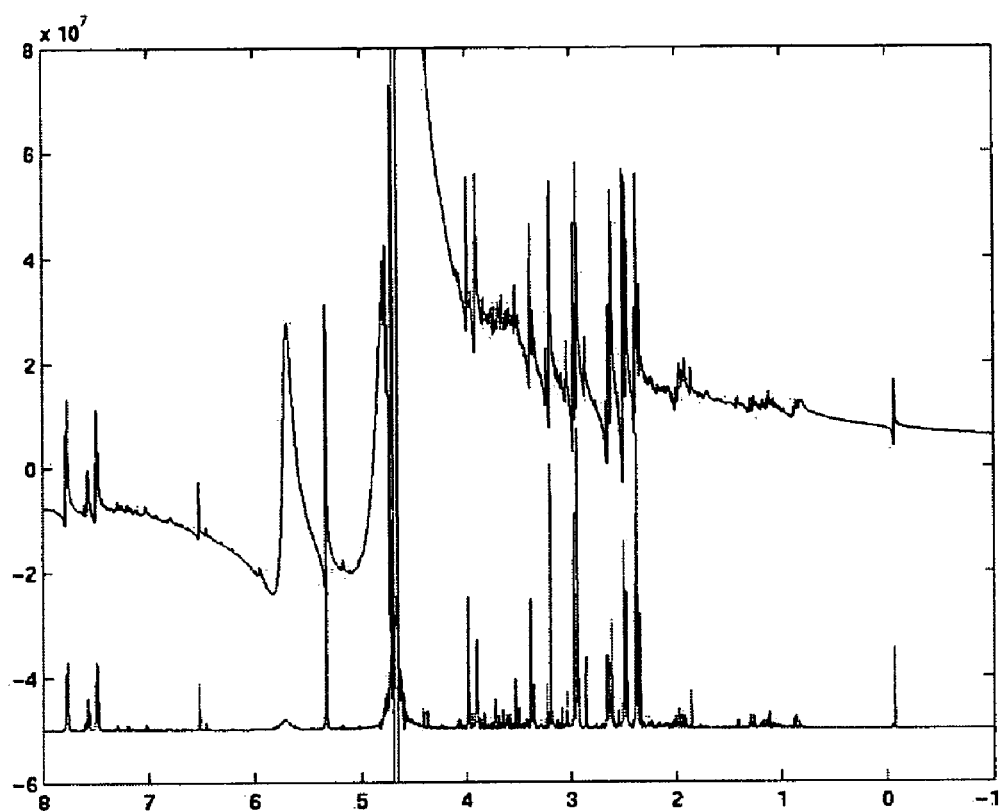
FIG. 13 shows an NMR spectrum of rat urine subject to a phase error (top) and the corresponding fingerprint.

FIG. 13 shows similar rat urine (top) as in FIG. 12 and the absolute value of the first derivative of the corresponding complex spectrum (bottom) which is not affected by phasing errors.

REFERENCE LIST

/1/ D. L. Massart, B. G. M. Vandeginste, L. M .C. Buydens, S. de Jong, P. J. Lewi, and J. Smeyers-Verbeke: "Handbook of Chemometrics and Qualimetrics: Part A" Elsevier Amsterdam—Lausanne—New York—Oxford—Shannon—Singapore—Tokyo" 1997

/2/ B. G. M. Vandeginste, D. L. Massart, L. M. C. Buydens, S. de Jong, P. J. Lewi, and J. Smeyers-Verbeke: "Handbook of Chemometrics and Qualimetrics: Part B" Elsevier Amsterdam—Lausanne—New York—Oxford—Shannon—Singapore—Tokyo" 1998

/3/ J. Edward Jackson: "A User's Guide to Principal Components" John Wiley & Sons, Inc., New York Chichester Brisbane Toronto Singapore 1991

/4/ R. R. Ernst, G. Bodenhausen; and A Wokaun: "Principles of Nuclear Magnetic Resonance in One and Two Dimensions" Clarendon Press 1990

/5/ Horst Fribolin "Basic One- and Two-Dimensional NMR Spectroscopy" VCH Verlagsgesellschaft, Weinheim, 1991

/6/ L. Cheng, Z. Weng, L. Y. Goh, and M. Garland "An efficient algorithm for automatic phase correction of NMR spectra based on entropy minimization" Journal of Magnetic Resonance 158 (2002) 164–168

/7/ D. E. Brown, T. W. Campell, and R. N. Moore "Automated Phase Correction of FT NMR Spectra by Baseline Optimization" Journal of Magnetic Resonance 85 (1989) 15–23

/8/ E. C. Craig and A. G. Marshall: "Automated Phase Correction of FT NMR Spectra by Means of Phase Measurment Based on Dispersion versus Absorption Relation (DISPA)" Journal of Magnetic Resonance 76 (1988) 458475

/9/ G. A. Pearson "A General Baseline-Recognition and Baseline Flattening Algorithm" Journal of Magnetic Resonance 27 (1977) 265–272

We claim:

1. A method of resonance spectroscopy for the analysis of statistical properties of samples, the method comprising the steps of:
  a) recording a complex resonance frequency spectrum of each sample by means of phase sensitive quadrature detection;
  b) numerically differentiating the recorded complex resonance frequency spectra with respect to frequency;

c) determinating an absolute value of each differentiated complex resonance frequency spectrum to obtain a fingerprint;

d) allocating each fingerprint to a point in a multidimensional point set;

e) performing a pattern analysis of the multidimensional point set to characterize statistical properties of the samples.

2. The method of claim 1, wherein the pattern analysis of step e) comprises at least one of Principal Component Analysis (=PCA), Cluster-Analysis, Multidimensional Scaling, or K-Nearest-Neighbor-Analysis (=KNN).

3. The method of claim 1, wherein the pattern analysis of step e) comprises a regression process.

4. The method of claim 3, wherein the regression process comprises at least one of a Multivariate Least Squares Regression (=MLR), a Reduced Rank Regression (=RRR), a Principal Component Regression (=PCR), or a Partial Least Squares Regression (=PLS).

5. The method of claim 1, wherein the pattern analysis of step e) comprises at least one of a Discriminant Analysis, a Canonical Correlation Analysis (=CCA), an application of neuronal networks, or an application of genetic algorithms.

6. The method of claim 1, wherein the pattern analysis of step e) comprises a SIMCA classification.

7. The method of claim 1, wherein the allocation of each fingerprint in step d) is performed with a Wavelet process.

8. The method of claim 1, wherein the samples originate from a single test object, the samples being taken at different times.

9. The method of claim 1, wherein each sample originates from a different test object.

10. A method of resonance spectroscopy for analysis of the properties of a sample, the method comprising the steps of:

a) recording a complex resonance frequency spectrum of the sample using phase sensitive quadrature detection;

b) numerically differentiating the recorded complex resonance frequency spectrum with respect to frequency;

c) determining an absolute value of the differentiated complex resonance frequency spectrum to obtain a fingerprint;

d) phase correcting the complex resonance frequency spectrum using the fingerprint as an objective function for a real part of the complex resonance frequency spectrum.

11. The method of claim 10, wherein the method of resonance spectroscopy is a Fourier spectroscopy method.

12. The method of claim 10, wherein the method of resonance spectroscopy is a nuclear magnetic resonance (=NMR) method.

13. The method of claim 12, wherein the method is a high resolution NMR method.

14. The method of claim 10, wherein the method is one of an electron spin resonance (=ESR) method or an ion cyclotron resonance (=ICR) method.

15. The method of claim 10, wherein the resonance spectroscopy method determines: one of acoustic, electrical or magnetic resonances.

16. The method of claim 10, wherein the sample or the samples comprise at least one of biofluids, urine, blood, spinal cord liquid, plant extracts, biological semi-solid material, tissue, biological solid material, or bone.

17. The method of claim 10, wherein the sample or the samples comprise at least one of foodstuff or intermediate products of foodstuff.

18. The method of claim 10, wherein the method is structured for use in at least one of material tests, criminology, detection of drugs, or determining an origin of drugs.

* * * * *